US009425160B1

(12) United States Patent
Alvarado et al.

(10) Patent No.: US 9,425,160 B1
(45) Date of Patent: Aug. 23, 2016

(54) WAFER-LEVEL PACKAGE DEVICE WITH SOLDER BUMP REINFORCEMENT

(71) Applicant: Maxim Integrated Products, Inc., San Jose, CA (US)

(72) Inventors: Reynante Alvarado, San Diego, CA (US); Yi-Sheng A. Sun, San Jose, CA (US); Arkadii V. Samoilov, Saratoga, CA (US); Yong L. Xu, Plano, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 204 days.

(21) Appl. No.: 13/803,179

(22) Filed: Mar. 14, 2013

(51) Int. Cl.
*H01L 23/48* (2006.01)
*H01L 23/52* (2006.01)
*H01L 29/40* (2006.01)
*H01L 23/12* (2006.01)
*H01L 23/00* (2006.01)

(52) U.S. Cl.
CPC ............... *H01L 24/33* (2013.01); *H01L 24/83* (2013.01)

(58) Field of Classification Search
CPC .............. H01L 2224/16; H01L 2924/01079; H01L 23/10; H01L 2924/01078; H01L 2924/01029; H01L 2924/01013; H01L 2224/13099; H01L 2224/48091; H01L 24/33; H01L 24/83; H01L 2924/14; H01L 23/49822

USPC ......... 257/737, 738, 730, 731, 733, 778, 780, 257/782, 783, 786
See application file for complete search history.

(56) References Cited

U.S. PATENT DOCUMENTS

| | | | |
|---|---|---|---|
| 6,350,668 B1 * | 2/2002 | Chakravorty | 438/612 |
| 6,608,384 B2 * | 8/2003 | Isozaki | 257/772 |
| 2010/0015796 A1 * | 1/2010 | Tago et al. | 438/614 |
| 2011/0001250 A1 * | 1/2011 | Lin et al. | 257/778 |
| 2011/0240355 A1 * | 10/2011 | Nakamura et al. | 174/260 |
| 2012/0067636 A1 * | 3/2012 | Kim | H01L 23/49822 174/260 |

* cited by examiner

*Primary Examiner* — A. Sefer
*Assistant Examiner* — Dilinh Nguyen
(74) *Attorney, Agent, or Firm* — Advent, LLP

(57) ABSTRACT

Wafer-level package (semiconductor) devices are described that have a reinforcement layer formed on an adhesion layer and/or a semiconductor substrate and covering at least a portion of at least one solder bump. Additionally, the reinforcement layer may cover at least a portion of a semiconductor device (e.g., a die) mounted on the semiconductor substrate. In an implementation, the wafer-level package (semiconductor) device may include an integrated circuit chip with an attached die, where the integrated circuit chip has at least one solder bump formed thereon with a reinforcement layer formed on a surface of the integrated circuit chip, where the reinforcement layer embeds the die and covers a portion of the at least one solder bump.

10 Claims, 9 Drawing Sheets

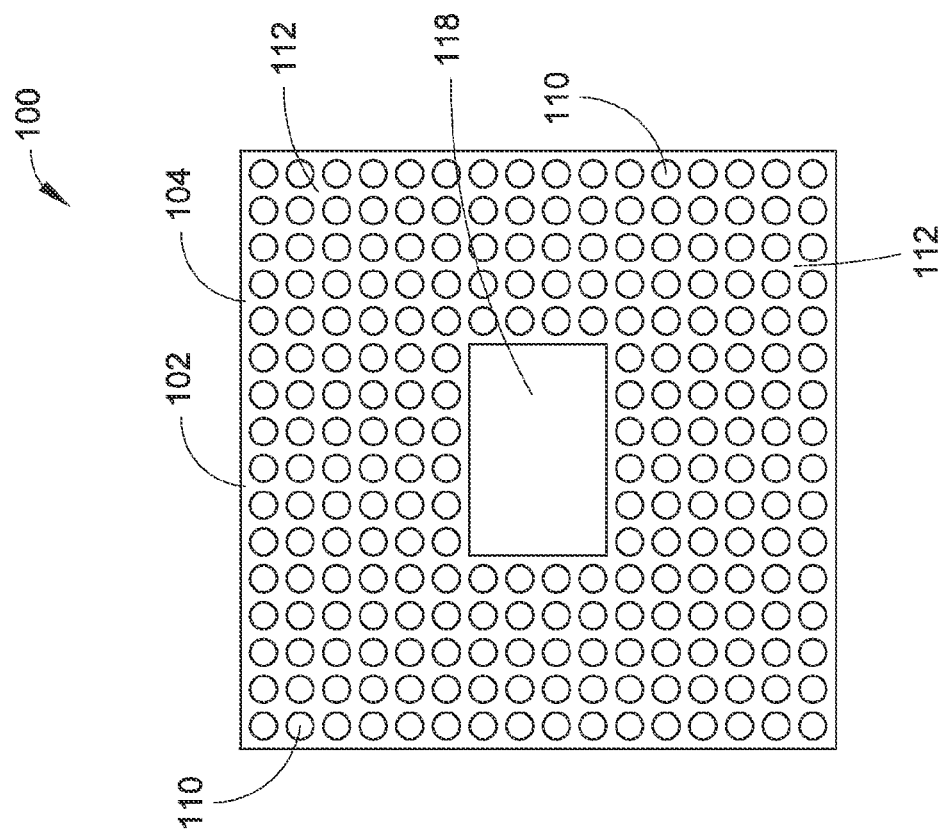
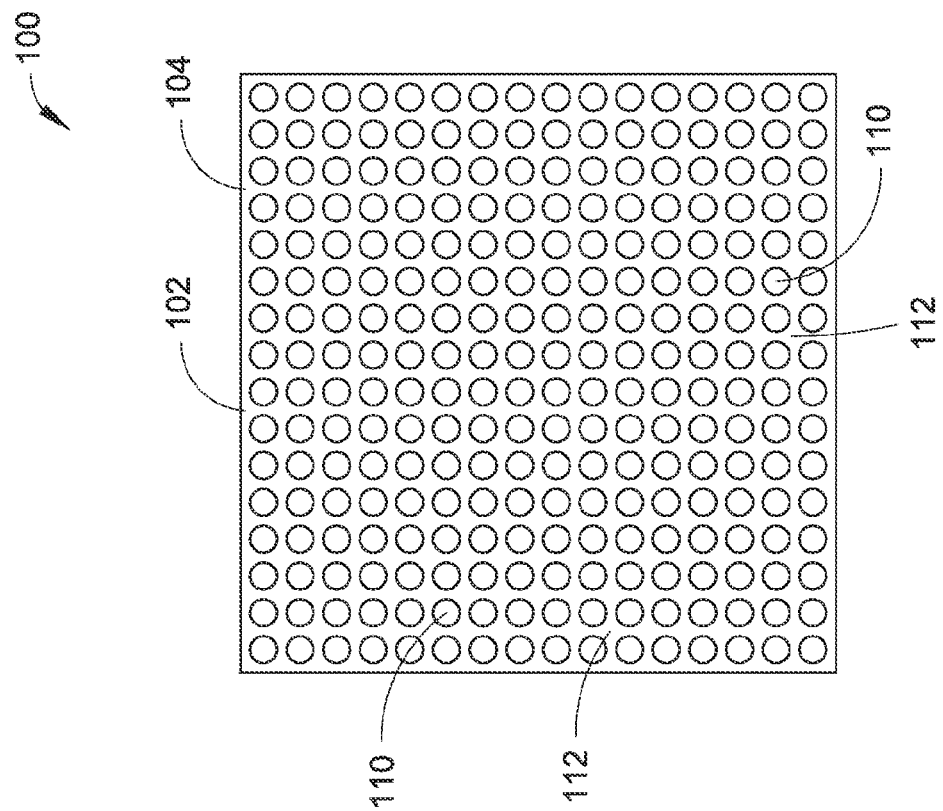
FIG. 1F
FIG. 1E

WAFER-LEVEL PACKAGE DEVICE WITH SOLDER BUMP REINFORCEMENT

BACKGROUND

Traditional fabrication processes used in the manufacture of semiconductor devices employ microlithography to pattern integrated circuits onto a circular wafer formed of a semiconductor such as silicon, gallium arsenide, and so forth. Typically, the patterned wafers are segmented into individual integrated circuit chips or dies to separate the integrated circuits from one another. The individual integrated circuit chips are assembled or packaged using a variety of packaging technologies to form semiconductor devices that may be mounted to a printed circuit board.

Over the years, packaging technologies have evolved to develop smaller, cheaper, more reliable, and more environmentally-friendly packages. For example, chip-scale packaging technologies have been developed that employ direct surface mountable packages having a surface area that is no greater than 1.2 times the area of the integrated circuit chip. Wafer-level packaging (WLP) is a chip-scale packaging technology that encompasses a variety of techniques whereby integrated circuit chips are packaged at wafer level prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level.

SUMMARY

Techniques are described for fabricating a wafer-level package (semiconductor) device that has one or more solder bumps with a reinforcement layer. In implementations, the wafer-level package device includes an integrated circuit chip (semiconductor device) with an adhesion interface and a bump interface on the integrated circuit chip. One or more solder bumps are placed on the bump interface with a reinforcement layer formed on the adhesion interface and covering a portion of the solder bumps. Additionally, the wafer level package device may include a solder bump array with a reinforcement layer that has a depopulated portion configured to include another semiconductor device, such as a flip chip.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

FIG. 1E is a top plan view illustrating a wafer-level package device in accordance with example implementations of the present disclosure.

FIG. 1F is a top plan view illustrating a wafer-level package device in accordance with example implementations of the present disclosure.

DETAILED DESCRIPTION

Overview

Figure 1A:
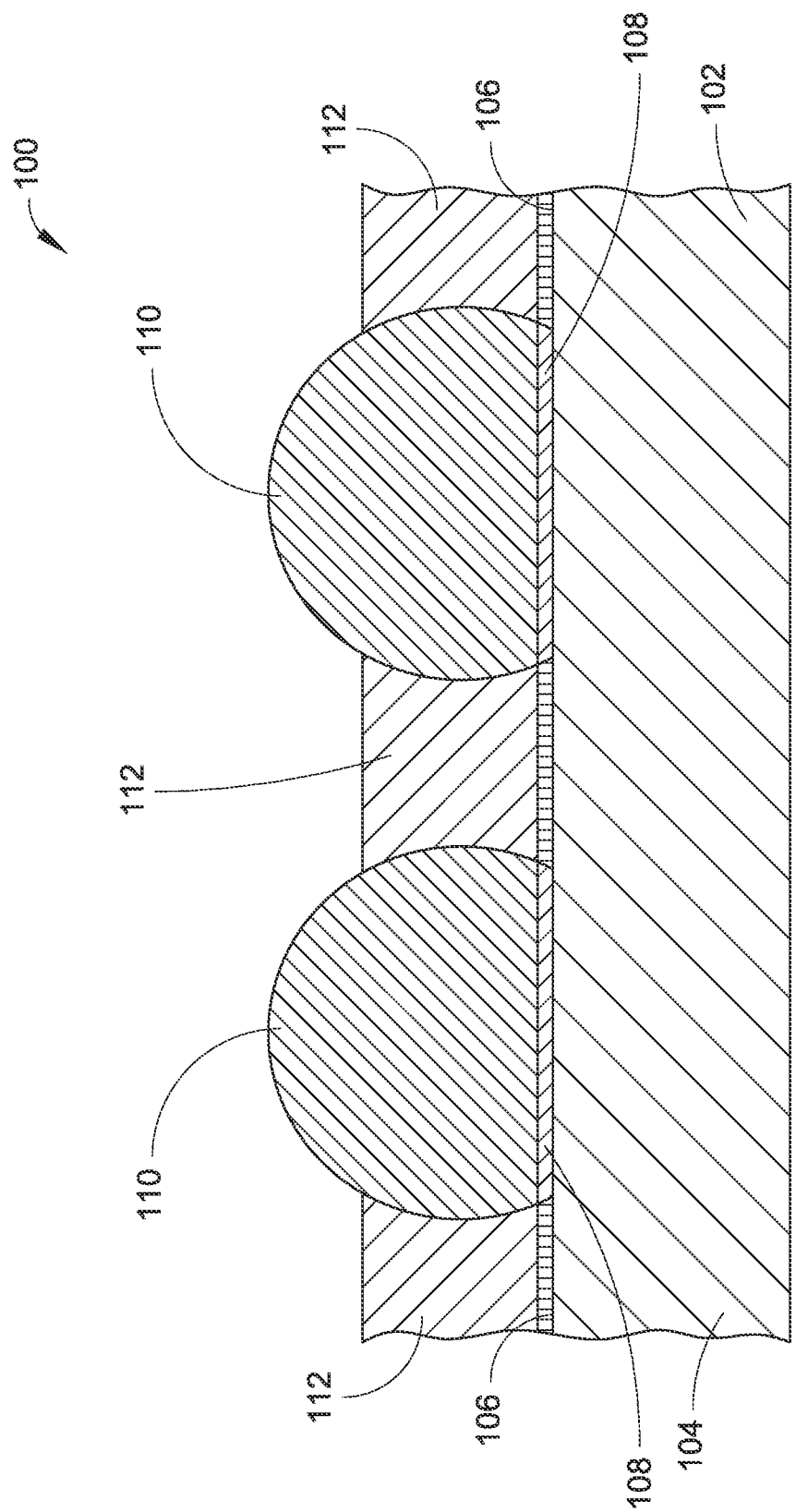
FIG. 1A is a diagrammatic partial cross-sectional side elevation view illustrating a wafer-level package device in accordance with example implementations of the present disclosure.
Figure 1B:
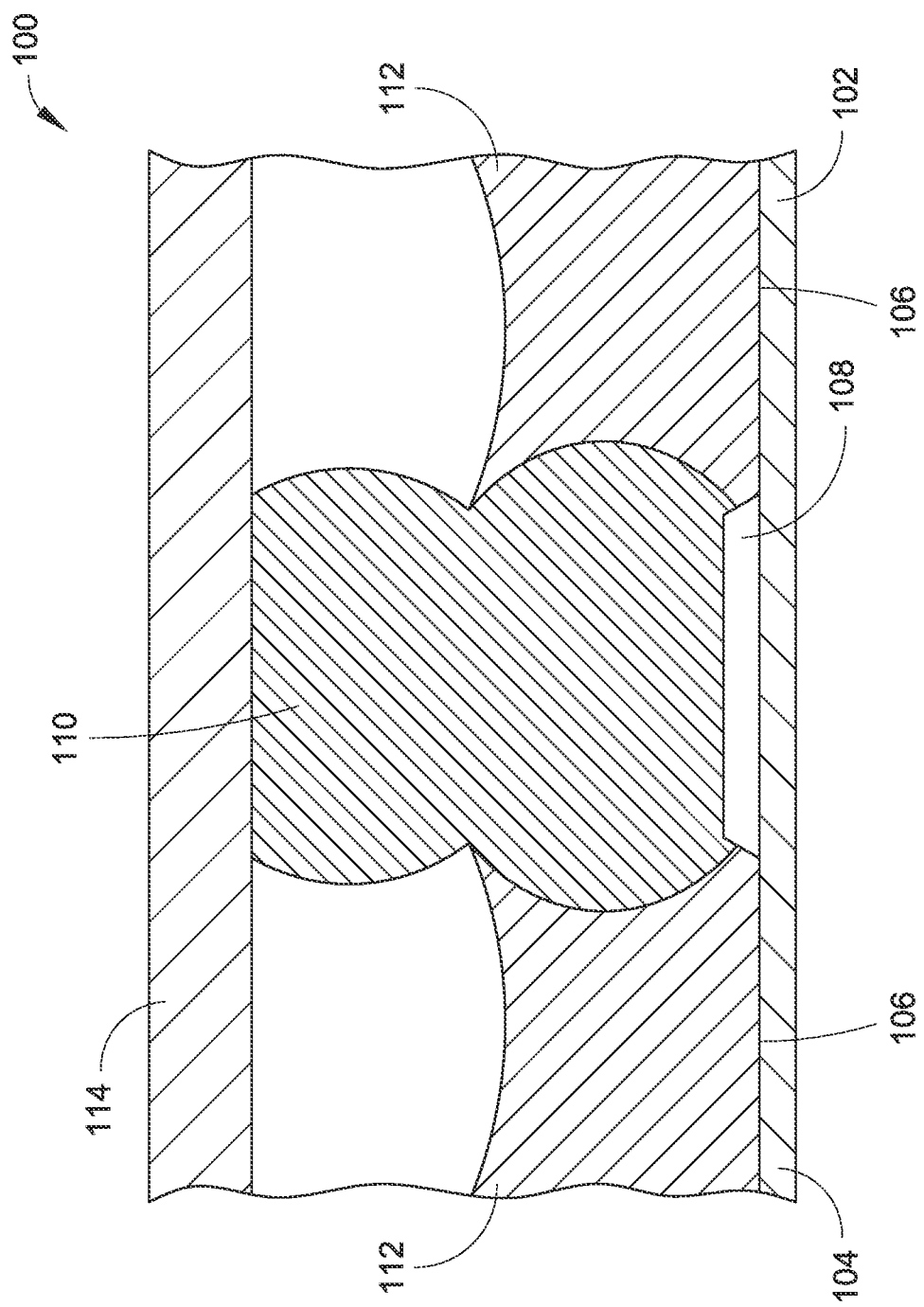
FIG. 1B is a diagrammatic partial cross-sectional side elevation view illustrating a wafer-level package device in accordance with example implementations of the present disclosure.

Wafer-level packaging facilitates the production of semiconductor devices that are lower in cost, have smaller form factors, and provide lower parasitic effects than devices manufactured utilizing many other packaging technologies. However, the application of wafer-level packaging techniques has heretofore been limited to use in the production of devices using small integrated circuit chips (e.g., devices with die having a surface area of less than about 25 mm$^2$). For devices employing larger chips (e.g., devices with die having a surface area of greater than about 25 mm$^2$), the mismatch of the coefficient of thermal expansion (CTE) between the chip and the printed circuit board (PCB) to which the device is mounted becomes significant and contributes to board level reliability and performance degradation. During thermal cycling and other physical tests, this CTE mismatch can cause high stress and cracks in solder bumps used to mount a device to a printed circuit board. Additionally, physical and mechanical force applied to the chip, solder bumps, and/or PCB can cause cracks in the solder bumps.

Accordingly, wafer-level packaging techniques are described for fabricating wafer-level package (or semiconductor) devices that have one or more solder bump assemblies, which include at least one solder bump and a reinforcement layer proximate to a portion of each solder bump, while leaving a portion of each solder bump exposed. The reinforcement layer mitigates stress within the solder bumps allowing for larger and more durable solder bump arrays and semiconductor devices. The reinforcement layer may function as a physical barrier to crack propagation and may protect and strengthen the solder joint between the solder bump and the bump interface (e.g., under-ball metallization).

In implementations, a reinforcement layer is formed proximate to an array of solder bumps and on an adhesion layer and over the surface of a semiconductor substrate and/or integrated circuit chip. In this implementation, the reinforcement layer may be formed so that a portion of each solder bump in the array is partially covered while a portion of each solder bump is exposed. In some implementations, the integrated circuit chip may include a solder bump array with a solder bump depopulated portion. In this implementation, a second semiconductor device, such as a flip chip ((controlled collapse chip connection (C4)), may be attached to the integrated circuit chip in the solder bump depopulated portion.

Example Implementations

FIGS. 1A through 1F illustrate semiconductor devices 100 in accordance with example implementations of the present disclosure. As shown, the semiconductor devices 100 include an substrate 104 and an integrated circuit chip 102 having at least one solder bump 110 disposed over an adhesion interface 106 on the substrate 104 (e.g., directly on the surface, on an intermediate layer or structure formed on the substrate 104, combinations thereof, and so forth). The substrate 104 and integrated circuit chip 102 may be fabricated as a portion of a semiconductor wafer, such as a silicon wafer (e.g., p-type wafer, n-type wafer, and so forth), a germanium wafer, and so forth, that includes one or more integrated circuits formed therein. The integrated circuits may be formed through suitable front-end-of-line (FEOL) fabrication techniques. Additionally, the integrated circuits may be configured in a variety of ways. For example, the integrated circuits may be comprised of digital circuit technology, analog circuit technology, mixed-signal technology, and so forth.

The semiconductor devices 100 illustrated in FIGS. 1A through 1F include an adhesion interface 106 on the substrate 104 and integrated circuit chip 102. The adhesion interface 106 may be formed proximate to the surface of the substrate 104. In embodiments, the adhesion interface 106 may be formed as a portion of the substrate 104 or may be formed as an additional layer (e.g., a thin film, such as a polybenzoxozole (PBO) layer). In an implementation, the adhesion interface 106 is formed as a portion of the substrate 104 where the surface of the substrate 104 acts as the adhesion interface 106. In this implementation, a reinforcement layer 112 adheres directly to the surface of the substrate 104. The adhesion interface 106 may serve to provide suitable adhesion between the integrated circuit chip 102 and/or substrate 104 and the reinforcement layer 112 (e.g., layer of epoxy). In some implementations, the adhesion interface 106 may include a thin film, a dielectric layer, or other layer configured to provide suitable adhesion between the integrated circuit chip 102 and/or substrate 104 and the reinforcement layer 112. In other implementations, the adhesion interface 106 may include a dielectric layer formed on the substrate 104 (e.g., an oxide ($SiO_2$) material, a nitride ($Si_3N_4$) material, a benzocyclobutene (BCB) polymer material, etc.).

The semiconductor devices 100 illustrated in FIGS. 1A through 1F may employ a Bump-On-Pad ("BOP") configuration or a Redistribution Layer ("RDL"). A BOP configuration may include each bump interface 108 (e.g., UBM pad, Cu pillar) being directly in contact with each solder bump 110. An RDL configuration includes a redistribution (RDL) structure comprised of a thin-film metal (e.g., aluminum, copper) rerouting and interconnection system that redistributes electrical connections to an array of bump interfaces (e.g., UBM pads) that may be more evenly deployed over the semiconductor devices 100. The UBM pads and/or RDL may have a variety of compositions. For example, a UBM pad or RDL layer may include multiple layers of different metals (e.g., Aluminum (Al), Nickel (Ni), Copper (Cu), vanadium, and so forth) that may function as an adhesion layer, a diffusion barrier layer, a solderable layer, an oxidation barrier layer, etc. The solder bumps 110 are subsequently placed on these bump interfaces 108 to form solder bump assemblies.

As illustrated in FIGS. 1A through 1F, the solder bumps 110 may furnish mechanical and/or electrical interconnection between each bump interface 108 and corresponding contact pads 116 of a printed circuit board 114 or other semiconductor device. In implementations, the solder bumps 110 may be fabricated of a lead-free solder such as a Tin-Lead (PbSn), Tin-Silver-Copper (Sn—Ag—Cu) alloy solder (i.e., SAC), a Tin-Silver (Sn—Ag) alloy solder, a Tin-Copper (Sn—Cu) alloy solder, and so on. In some implementations, the solder bumps 110 may be formed from solder balls using a ball drop process. Example processes for forming the solder bumps 110 using wafer-level packaging techniques are described in more detail below. Additionally, the solder bumps 110 may be different sizes. In some examples, the diameter of the solder bumps 110 may be about forty micrometers to about two hundred fifty micrometers.

As illustrated in FIGS. 1A through 1F, a reinforcement layer 112 is formed on the adhesion interface 106 covering a portion of each solder bump 110. The reinforcement layer 112 may include materials suitable for adhering to each solder bump 110 and adhesion interface 106, (e.g., an epoxy-based resin or polymer). In implementations, a layer of an epoxy-based mold compound is formed on the adhesion interface 106 covering a portion of each solder bump 110 leaving a top portion of each solder bump 110 exposed farthest (e.g., distal) from the integrated circuit chip 102. Forming the reinforcement layer 112 proximate to a portion of the solder bumps 110 may serve to provide a stress point on the bulk of the solder bump 110 instead of having a stress point at the adhesion interface 106 and the bump interface 108. Repositioning the stress point to the interface of the reinforcement layer 112 surface and each solder bump 110 reduces stress on the solder bump(s) 110 and mitigates joint failure, distress, and mismatch of the solder bump(s) 110. In a specific embodiment, an array of solder bumps 110 is formed on an adhesion interface 106 where the solder bumps 110 have a height of approximately 180 µm. In this specific embodiment, a reinforcement layer 112 is formed on the adhesion interface 106, where the height of the reinforcement layer 112 is about 115 µm, which leaves about 65 µm of each solder bump 110 exposed. It is contemplated that other configurations may be used when determining component dimensions. In some implementations, the reinforcement layer 112 may range from 100 µm or less to approximately 150 µm or more. Additionally, the surface of the reinforcement layer 112 may be substantially flat in some embodiments, while in other embodiments, the surface of the reinforcement layer 112 may not be planar (e.g., the surface may be curved, for example a meniscus). The exposed portion of each solder bump 110 may serve as a mechanical and/or electrical connection between the integrated circuit chip 102 and another semiconductor device (e.g., a printed circuit board) subsequent to a reflow process. In some implementations, the exposed portion of each solder bump 110 may range from 30 µm or less to about 100 µm or more depending on the application. The reinforcement layer 112 may be formed using a mold compression process, which is further discussed below.

Figure 1C:
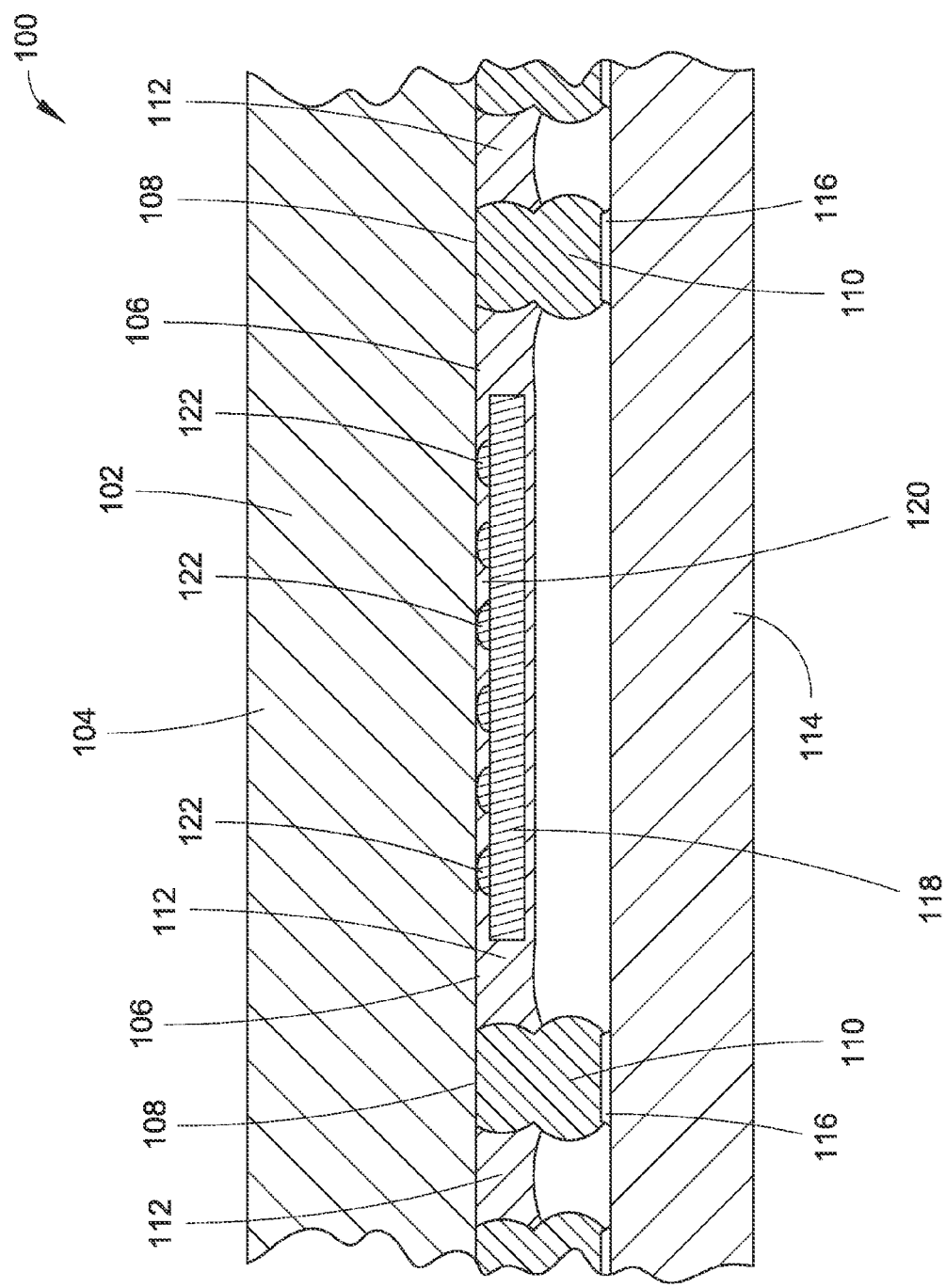
FIG. 1C is a diagrammatic partial cross-sectional side elevation view illustrating a wafer-level package device in accordance with example implementations of the present disclosure.
Figure 1D:
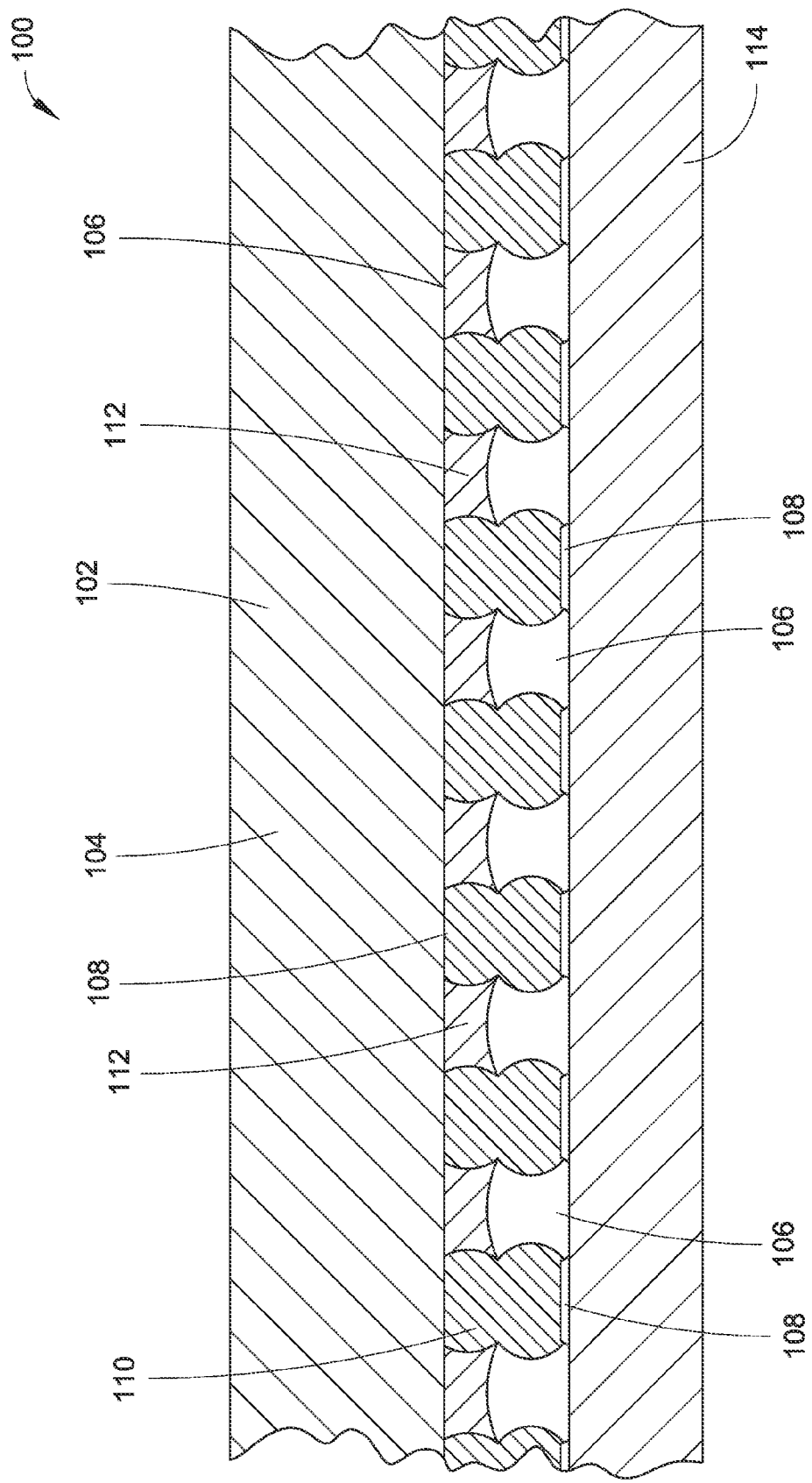
FIG. 1D is a diagrammatic partial cross-sectional side elevation view illustrating a wafer-level package device in accordance with example implementations of the present disclosure.

In embodiments and as illustrated in FIGS. 1C and 1F, the semiconductor devices 100 may further include an attached embedded die 118 to a solder bump depopulated portion of an integrated circuit chip 102. In an implementation, a semiconductor device 100 may include an array of solder bumps 110 formed on the integrated circuit chip 102 and bump interfaces 108. In this implementation, a portion of the array of solder bumps 110, such as the middle portion illustrated in FIG. 1F, may be depopulated of solder bumps 110 for placing and attaching a embedded die 118 (e.g., a flip chip) or other semiconductor device to the integrated circuit chip 102. In this implementation, the embedded die 118 may be attached to the integrated circuit chip 102 using surface-mount technology, such as using through-hole technology, pins or leads of various styles, wire bonding, flat contacts, or an array of solder bumps 110 as illustrated in FIG. 1C. Additionally, the embedded die 118 may be attached with an underfill layer 120. The underfill layer 120 may include a non-conductive but mechanically protective material (e.g., epoxy) configured to fill the open spaces between the embedded die 118 and the integrated circuit chip 102. Additionally, the underfill layer 120 may include the same material as the reinforcement layer 112 or may include another material (e.g., an electrically insulating adhesive). As shown in FIG. 1C, the reinforcement layer 112 may be formed on an adhesion interface 106, proximate to a portion of each solder bump 110, and proximate to at least one side of an attached embedded die 118. In an embodiment, the integrated circuit chip 102 with the attached embedded die 118 and reinforcement layer 112 may be further attached to a printed circuit board 114. Further, FIG. 1C illustrates the embedded die 118 with an underfill layer 120 between the embedded die 118 and the printed circuit board 114.

FIG. 1E illustrates a top plan view of a full array of solder bumps with a reinforcement layer 112 formed between each of the solder bumps 110. FIG. 1F shows a solder bump depopulated array of solder bumps 110 with a reinforcement layer 112 formed on the adhesion interface 106 and between each solder bump 110. Additionally, FIG. 1F shows a embedded die 118 attached to the solder bump depopulated portion (e.g., the middle 6×4 portion) of the solder bump 110 array. Moreover, while FIGS. 1E and 1F illustrate a sixteen by sixteen (16×16) full and depopulated array of solder bumps 110, respectively, it is understood that other arrays may be utilized.

Example Fabrication Processes

Figure 2:
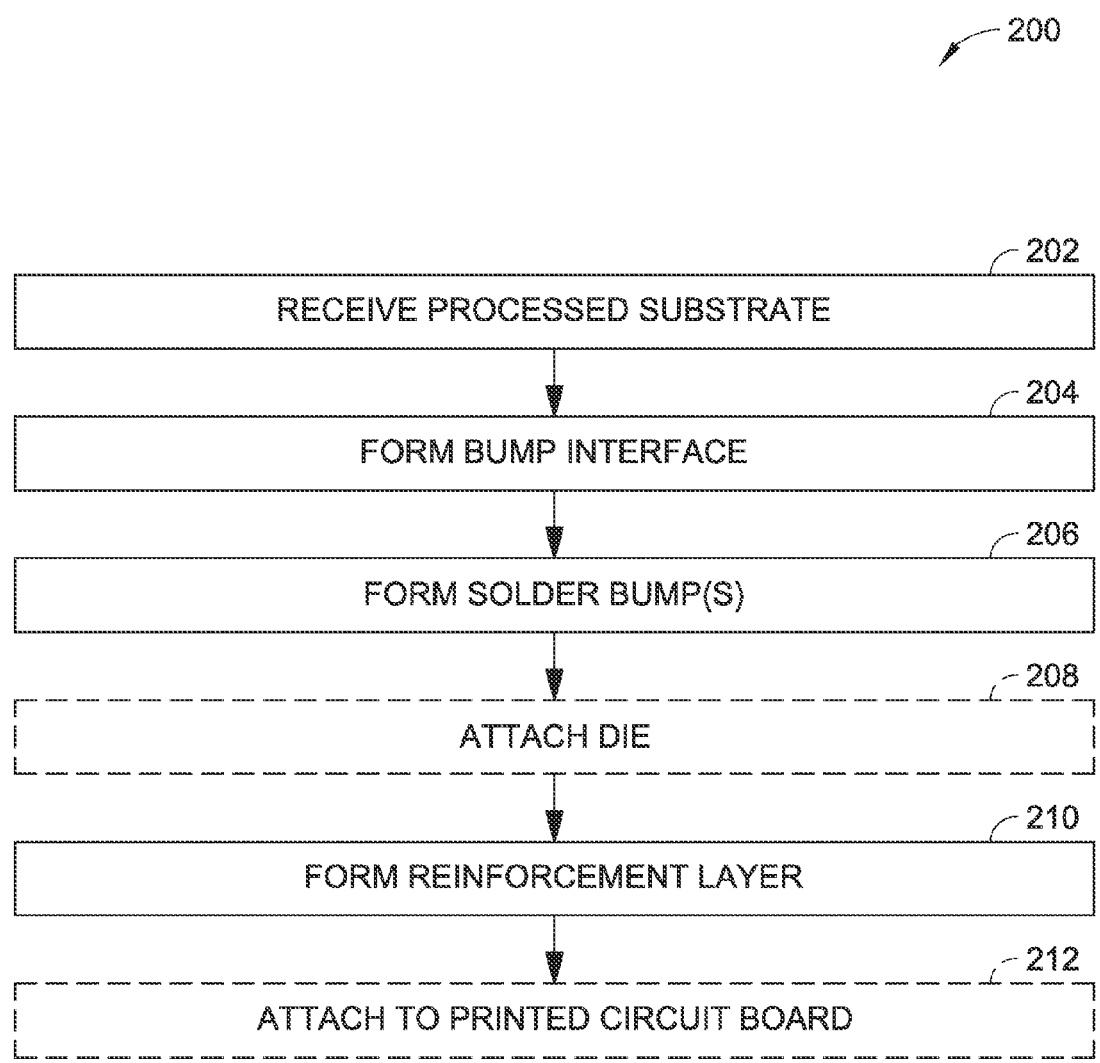
FIG. 2 is a flow diagram illustrating a process in an example implementation for fabricating wafer-level package devices, such as the device shown in FIGS. 1A through 1F.

FIG. 2 illustrates an example process 200 that employs wafer-level packaging techniques to fabricate semiconductor devices, such as the semiconductor devices 100 shown in FIGS. 1A through 1F. FIGS. 3A through 3D illustrate sections 300 of example substrate 304 that are utilized to fabricate semiconductor devices (such as devices 100 shown in FIGS. 1A through 1F).

Figure 3A:
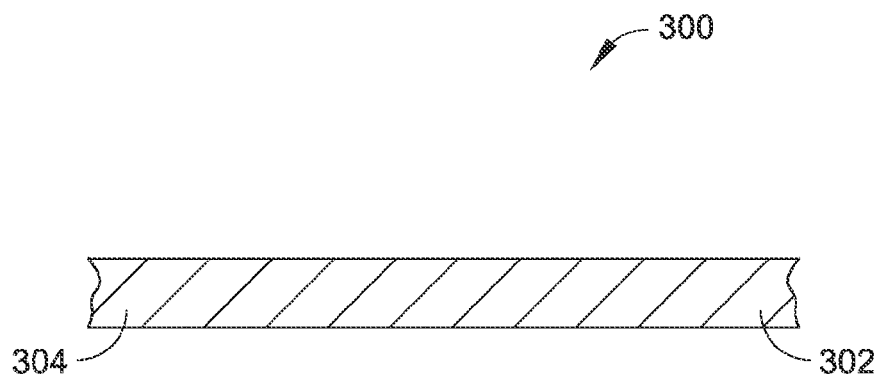
FIGS. 3A through 3E are diagrammatic partial cross-sectional side elevation views illustrating the fabrication of a wafer-level package device, such as the device shown in FIGS. 1A through 1F, in accordance with the process shown in FIG. 2.

A processed substrate (e.g., a semiconductor wafer) is received (Block 202). In FIG. 3A, a section 300 of the substrate 304 is illustrated prior to the substrate 304 (or semiconductor wafer) being segmented into individual semiconductor devices 100 (e.g. integrated circuit devices) shown in FIGS. 1A through 1F. It is contemplated that the sections 300 of the substrate 304 may include one or more integrated circuits formed therein forming at least one integrated circuit chip 302. The integrated circuits may be configured in a variety of ways. For example, the integrated circuits may be digital integrated circuits, analog integrated circuits, mixed-signal integrated circuits, and so forth. In one or more implementations, front-end-of-line techniques (FEOL) may be utilized to form the integrated circuits in the semiconductor wafer, such as the substrate 304 illustrated in FIG. 3A. Together, these integrated circuits form an integrated circuit chip 302 included as part of the substrate 304. The integrated circuits are connected to one or more conductive layers (e.g., bump interfaces 308, redistribution structures, etc.) that provide electrical contacts through which the integrated circuits are interconnected to other components associated with the semiconductor devices 100, such as printed circuit boards, and so forth.

Figure 3B:
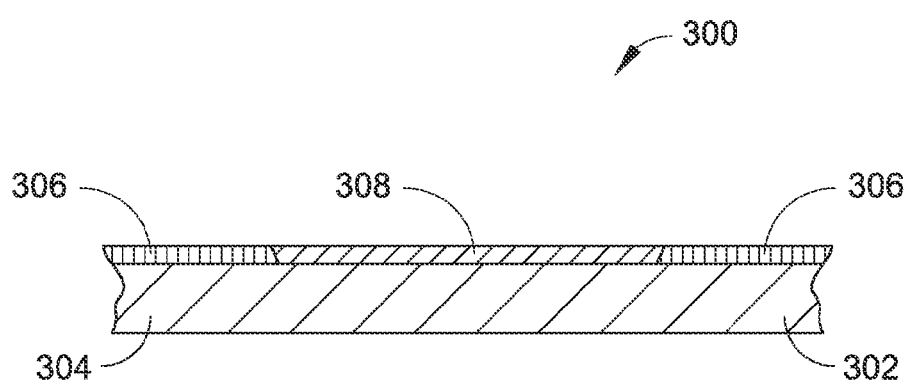

A bump interface is formed on the semiconductor substrate (Block 204). For example, as shown in FIG. 3B, bump interface 308 is formed on the substrate 304. In some implementations, forming the bump interface 308 may include forming under-bump metallization (UBM) applied to the integrated circuit chip 302. The UBM may include multiple layers of metals that function as an adhesion layer, a diffusion barrier layer, a solderable layer, and/or an oxidation barrier layer, etc. In an implementation, forming the bump interface 308 includes forming under-bump metallization that has been vacuum deposited by evaporation or sputtering. In another implementation, forming the bump interface 308 includes chemically plating the bump interface 308. In other implementations, forming the bump interface 308 may include forming interface structures other that a UBM, such as copper pillars, a Redistribution Layer, etc., using processes such as plating or physical vapor deposition. Additionally, the substrate 304 may include an adhesion interface 306, illustrated in FIG. 3B. The adhesion interface may be formed as a portion of the surface of the substrate 304 or integrated circuit chip 302. Additionally, an adhesion interface 306 may be formed as a separate layer and may include a thin film, a dielectric layer, or other layer configured to provide suitable adhesion between the integrated circuit chip 302 and/or substrate 304 and the reinforcement layer 312. An adhesion interface 306 may be selected for its ability to provide an adhesive interface between the substrate 304 and a reinforcement layer 312. In an implementation, forming an adhesion interface 306 may include forming a thin film (e.g., benzocyclobutene polymer (BCB), polyimide (PI), polybenzoazole (PBO), etc.).

Figure 3C:
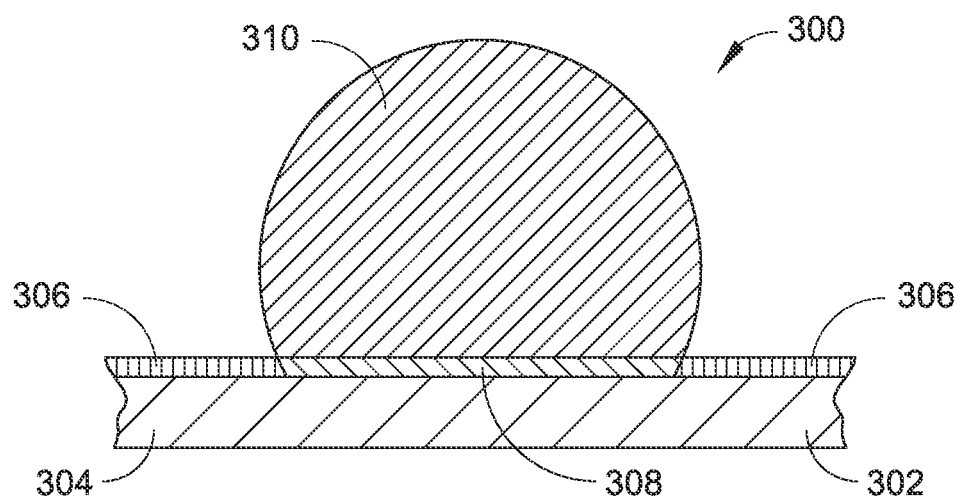

Solder bumps are formed on each bump interface (Block 206). FIG. 3C illustrates a solder bump 310 formed on the bump interface 308 (e.g., a UBM, an RDL, etc.). The solder bumps 310 may be formed in a variety of ways. In an implementation, the solder bumps 310 may be formed using a ball drop process. However, it is contemplated that the specific fabrication processes used may include other process operations without departing from the scope and spirit of the present disclosure. In other implementations, other techniques, such as solder paste printing, evaporation, electroplating, jetting, stud bumping, etc., may be used to form the solder bumps 310.

Figure 3D:
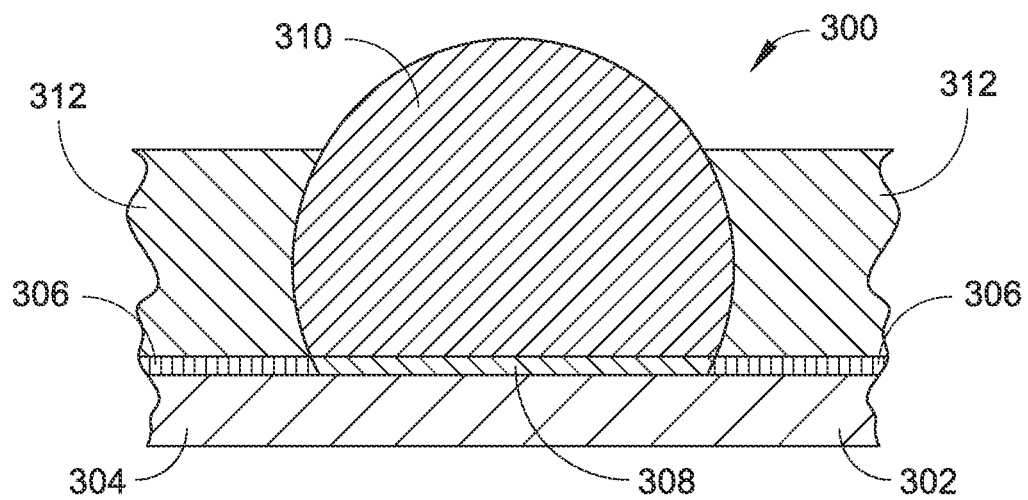
Figure 3E:
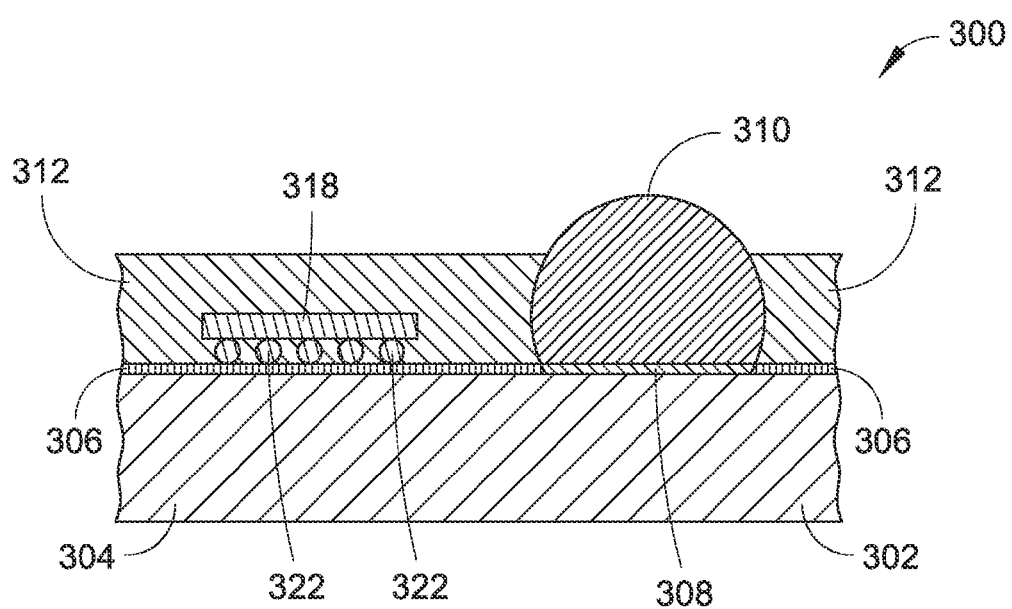

In some embodiments, a die may be attached to the integrated circuit chip in a depopulated solder bump portion of the formed solder bumps (Block 208). In an implementation, an array of solder bumps 310 may be depopulated from the integrated circuit chip 302 for the purpose of placing a die 318 (e.g., a flip chip die, a stack die, etc.) on the depopulated solder bump portion of the solder bump 310 array, as illustrated in FIG. 3E. The solder bumps 310 may be depopulated in a variety of ways. In one implementation, previously formed solder bumps 310 may be removed, for example by mechanical means, such as localized reflow or a removal device (e.g., a shear device). In another implementation, an array of solder bumps 310 may be formed in a depopulated manner with a portion of the substrate 304 being skipped in the initial formation of the array of solder bumps 310.

The die 318 may be attached a variety of ways. In some implementations, the die 318 may be placed on the substrate 304 using flip chip technology. Attaching or placing the die 318 on the substrate 304 may include interconnecting the substrate 304, such as an integrated circuit chip 302 and/or microelectromechanical system (MEMS), to the die 318 or other external circuitry with bonding pads and solder connections (e.g., solder bumps 310), for example, that have been deposited on the die 318. Mounting the die 318 to circuitry (e.g, a circuit board, the integrated circuit chip 302, etc.) may include flipping the die 318 (e.g., a flip chip) so that the side with electrical connections faces down and aligning the die 318 so that its electrical connection pads align with matching pads on the substrate 304. A subsequent reflow process may be used to melt the solder bumps and secure the solder to the bump interfaces 308. Along with the subsequent reflow process, an underfill process may be used to fill the remaining open space between the reinforcement layer 312 and the die 318 or other external device. In other implementations, the die 318 may be attached using die attach technology employing an adhesive, such as polyimide, epoxy, or silver-filled glass. The adhesive may be dispensed in a controlled amount on the substrate 304, and the die 318 may be then attached to the substrate 304. In other implementations, methods of die attachment technology may include eutectic die attach, which employs a eutectic alloy to attach the die 318 to the substrate 304. In eutectic die attach processes, eutectic alloys may be deposited by sputtering, dual source evaporation, or electroplating. Eutectic alloys may also be formed by diffusion reactions of pure metals and subsequent melting of the eutectic composition. In an additional implementation, attaching the die 318 includes using a pick-and-place process where robotic machines which are used to place surface-mount devices (SMDs) onto the substrate 304.

A reinforcement layer is formed on the adhesion interface and proximate to at least one solder bump (Block 210). FIG. 3D illustrates forming the reinforcement layer 312 over the adhesion layer 306 and covering a portion of the solder bump 310. The reinforcement layer 312 may be formed on a full array of solder bumps 310 or on a depopulated solder bump array of solder bumps 310. In an implementation and as illustrated in FIG. 3E, a depopulated solder bump portion is formed on the integrated circuit chip 302 and a die 318 is attached to the integrated circuit chip 302 in the depopulated solder bump portion, and the reinforcement layer 306 is formed proximate to each solder bump 310 and embedding the die 318 (e.g., flip chip), where the die 318 is attached to the integrated circuit chip 302 with solder bumps 322. In this example, forming the reinforcement layer 312 includes covering a portion of each solder bump 310 and the entire die 318 while leaving a portion of each solder bump 310 uncovered. In implementations, forming the reinforcement layer 312 may include forming a mold compound, such as a composite material including a polymer compound, epoxy resin, phenolic hardeners, silicas, catalysts, pigments, and mold release agents, etc. The material selected for forming the reinforcement layer 312 may be chosen for its ability to adhere to the solder bumps 310 and the adhesion layer 306 and/or the substrate 304. In an implementation, forming the reinforcement layer 312 includes forming an epoxy resin on an adhesion layer 306 (e.g., the surface of the substrate 304). In this specific implementation, the epoxy resin may be formed at a depth of approximately 120 μm leaving approximately 60 μm of each solder bump 310 exposed on a side distal from the substrate 304. In some implementations, the thickness of the reinforcement layer 312 may be from about 100-120 μm. However, it is contemplated that other depths and thicknesses of the reinforcement layer 312 may be formed.

In an implementation, a reinforcement layer 312 is formed and molded over the adhesion layer 306 and/or the substrate 304 and covering a portion of the solder bumps 310 using a molding process. In implementations, compression molding may be used to form the reinforcement layer 312. Compression molding may include placing a molding material (e.g., the reinforcement layer 312 material), generally preheated, in an open, heated mold cavity. The mold is closed with a top force or plug member, pressure is applied to force the material into contact with all mold areas (e.g., the adhesion interface 306, the solder bumps 310, etc.), while heat and pressure are maintained until the molding material has cured. In some implementations, transfer molding may be used because of its capability to mold small components with complex features. In transfer molding, a molding compound may be first pre-heated and loaded into a molding chamber. After preheating, the molding compound may be forced by a hydraulic plunger into a pot where it may reach melting temperature and become fluid. The plunger may then continue to force the fluid molding compound into the runners of the mold chase. These runners may serve as canals where the fluid molding compound travels until it reaches the cavities surrounding the solder bumps 310. The molding compound may then form the reinforcement layer 312 that surrounds a portion of the solder bumps 310 (and in some implementations the embedded die 318 while still leaving a portion of the solder bumps 310 exposed. In some implementations, a release film (e.g., Mylar, etc.) may be used in the molding process, where the release film may assist in controlling the volume of the mold material.

Once the wafer fabrication process is complete, suitable wafer-level packaging processes may be employed to segment and package the integrated circuit chips 302 into semiconductor devices. Subsequent to forming a reinforcement layer, the semiconductor device may be attached to a printed circuit board (Block 212). In some implementations, surface-mount technology may used, such as the use of soldered connections (e.g., a ball grid array), molding and encapsulation, and/or other finishing processes.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. A wafer-level package device, comprising:
an integrated circuit chip;
an adhesion interface disposed on a surface of the integrated circuit chip;
at least one bump interface disposed on the surface of the integrated circuit chip;
at least one solder bump formed on the at least one bump interface to provide a solder bump depopulated portion of the integrated circuit chip;
a reinforcement layer disposed on the adhesion interface and proximate to the at least one solder bump, where the reinforcement layer covers a portion of the at least one solder bump, and a portion of the at least one solder bump is exposed; and
a flip-chip die attached to the integrated circuit chip, where an exposed portion of the at least one solder bump is a reflowable connection between the wafer-level package device and a printed circuit board, and where the reinforcement layer is disposed on the adhesion interface and proximate to the at least one solder bump and covers the flip-chip die.

2. The wafer-level package device as recited in claim 1, wherein the adhesion interface comprises a dielectric material.

3. The wafer-level package device as recited in claim 1, wherein the at least one bump interface comprises an under-bump metallization layer (UBM).

4. The wafer-level package device as recited in claim 1, wherein the reinforcement layer comprises an epoxy resin-based material.

5. The wafer-level package device as recited in claim 1, wherein the reinforcement layer comprises approximately 120 μm of epoxy.

6. A semiconductor device, comprising:
   a printed circuit board; and
   a semiconductor device including
      an integrated circuit chip;
      an adhesion interface disposed on a surface of the integrated circuit chip;
      at least one bump interface disposed on the surface of the integrated circuit chip;
   at least one solder bump formed on the at least one bump interface to provide a solder bump depopulated portion of the integrated circuit chip;
   a reinforcement layer disposed on the adhesion interface and proximate to the at least one solder bump, where the reinforcement layer covers a portion of the at least one solder bump, and
   a portion of the at least one solder bump is exposed; and
   a flip-chip die attached to the integrated circuit chip, where an exposed portion of the at least one solder bump is a reflowable connection between the wafer-level package device and the printed circuit board, and where the reinforcement layer is disposed on the adhesion interface and proximate to the at least one solder bump and covers the flip-chip die.

7. The semiconductor device as recited in claim 6, wherein the adhesion interface comprises a dielectric material.

8. The semiconductor device as recited in claim 6, wherein the at least one bump interface comprises an under-bump metallization layer (UBM).

9. The semiconductor device as recited in claim 6, wherein the reinforcement layer comprises an epoxy resin-based material.

10. The semiconductor device as recited in claim 6, wherein the reinforcement layer comprises approximately 120 μm of epoxy.

* * * * *